(12) United States Patent
Toyoda et al.

(10) Patent No.: US 9,040,969 B2
(45) Date of Patent: May 26, 2015

(54) ORGANIC ELECTROLUMINESCENCE DISPLAY DEVICE AND METHOD FOR MANUFACTURING THE SAME

(71) Applicant: DENSO CORPORATION, Kariya, Aichi-pref. (JP)

(72) Inventors: Akito Toyoda, Nagoya (JP); Koujirou Tachi, Nagakute (JP); Masayuki Katayama, Handa (JP)

(73) Assignee: DENSO CORPORATION, Kariya (JP)

( * ) Notice: Subject to any disclaimer, the term of this patent is extended or adjusted under 35 U.S.C. 154(b) by 5 days.

(21) Appl. No.: 14/029,983

(22) Filed: Sep. 18, 2013

(65) Prior Publication Data
US 2014/0077197 A1    Mar. 20, 2014

(30) Foreign Application Priority Data

Sep. 20, 2012    (JP) ................. 2012-206458

(51) Int. Cl.
*H01L 51/05*    (2006.01)
*H01L 51/00*    (2006.01)
*H01L 51/52*    (2006.01)
*H01L 51/56*    (2006.01)

(52) U.S. Cl.
CPC ............ *H01L 51/5253* (2013.01); *H01L 51/56* (2013.01); *H01L 2251/568* (2013.01)

(58) Field of Classification Search
CPC ............ H01L 51/0545; H01L 51/0036; H01L 51/0541; H01L 51/5012; B82Y 10/00
USPC ........................................................ 257/40
See application file for complete search history.

(56) References Cited

U.S. PATENT DOCUMENTS

2002/0036462 A1* 3/2002 Hirano ................... 313/506
2004/0247949 A1* 12/2004 Akedo et al. ............ 428/704

(Continued)

FOREIGN PATENT DOCUMENTS

JP    11-312580 A    11/1999
JP    2001-328900 A    11/2001

(Continued)

OTHER PUBLICATIONS

KR 2006083628—Method for Testing Leakage Current of Organic Light emitting device which is a translation of Korean document KR 101104436B1.*

(Continued)

*Primary Examiner* — Steven Loke
*Assistant Examiner* — Didarul Mazumder
(74) *Attorney, Agent, or Firm* — Posz Law Group, PLC

(57) ABSTRACT

The organic electroluminescence display device has a laminated portion on a base substrate. The device may have a cavernous portion formed by exploding a part of the laminated portion in a screening processing. A protective layer is formed to cover a whole surface of a wall defining the cavernous portion. Therefore, substances contained in the air are prevented from contacting to an organic electroluminescence layer at least partially defining the cavernous portion. Therefore, even if moisture is contained in the air, it is possible to prevent moisture from being absorbed by the organic electroluminescence layer. Moreover, since moisture is not absorbed by the organic electroluminescence layer, it is possible to reduce irregular spot on the device. In addition, it is possible to reduce a short circuit at an open defective portion.

12 Claims, 4 Drawing Sheets

(56) References Cited

U.S. PATENT DOCUMENTS

| | | | |
|---|---|---|---|
| 2009/0200930 A1* | 8/2009 | Hayashi | 313/504 |
| 2010/0019664 A1 | 1/2010 | Mishima | |
| 2010/0051992 A1* | 3/2010 | Kobayashi et al. | 257/98 |
| 2010/0178481 A1 | 7/2010 | George et al. | |
| 2011/0018434 A1* | 1/2011 | Miyaguchi | 313/512 |
| 2011/0248247 A1* | 10/2011 | Matsumoto et al. | 257/40 |
| 2012/0121932 A1 | 5/2012 | George et al. | |
| 2013/0168644 A1* | 7/2013 | Park | 257/40 |

FOREIGN PATENT DOCUMENTS

| | | |
|---|---|---|
| JP | 2002-359070 A | 12/2002 |
| JP | 2007-090803 A | 4/2007 |
| JP | 2008-097828 A | 4/2008 |
| JP | 2009-211994 A | 9/2009 |
| JP | 2010-118162 A | 5/2010 |
| JP | 2010-147257 A | 7/2010 |
| JP | 2012-190781 A | 10/2012 |
| KR | 101104436 B1 * | 1/2012 |

OTHER PUBLICATIONS

Office Action mailed Jul. 22, 2014 in the corresponding JP application No. 2012-206458 (with English translation).

Office Action mailed Jul. 31, 2014 in the corresponding KR application No. 10-2013-0109648 (with English translation).

* cited by examiner

ORGANIC ELECTROLUMINESCENCE DISPLAY DEVICE AND METHOD FOR MANUFACTURING THE SAME

CROSS REFERENCE TO RELATED APPLICATION

This application is related to and claims priority from Japanese Patent Application No. 2012-206458 filed on Sep. 20, 2012, the contents of which are hereby incorporated by reference.

TECHNICAL FIELD

The present invention relates to an organic electroluminescence display device and a method for manufacturing the same. The organic electroluminescence display device has laminated portion in which layers at least including an anode, an organic electroluminescence layer, and a cathode are laminated.

BACKGROUND

Conventionally, the organic electroluminescence device is known. For example, JPH11-312580A discloses such a device in which an anode, an organic electroluminescence layer, and a cathode, are laminated in this sequence on a base substrate. In this patent document, it is proposed that a method for electrically restoring a leakage portion among elements in the device after a plurality of elements of the organic electroluminescence device is formed on the base substrate. The method may be referred to as a self-restoration method for leakage portions.

In this method, the elements are formed, after that, a leakage portion among the elements is broken or destroyed by supplying electric current to the elements, then the leakage portion is oxidized and insulated. Thereby, it is possible to perform a self-restoration at the leakage portion in an electrical manner, and to turn the leakage portion into a nonconductive portion.

After the method, a protective layer is formed on the elements in order to protect the elements by a vapor deposition method. Thereby, an upper layer, e.g., cathode, and the nonconductive portion are covered with the protective layer. JP2009-211994A discloses a method for picking defective devices up by detecting an instantaneous leak current which shows a breakage when a thickness of the cathode is equal to or more than 135 nm (nanometers). This conventional method merely picks defective devices up, since an open defective portion created by the breakage portion may cause a short circuit when it is activated and driven at an actual usage.

SUMMARY

However, in the above-mentioned conventional method, the leakage portion may adversely create an irregular spot depending on a breakage shape of the leakage portion, when the leakage portion is broken by supplying electric current to the elements. Irregular spot may be a dark spot which emits light differently from other adjacent elements. For example, an overhang protrusion, which may be called as an umbrella, may be formed by at least one of the organic electroluminescence layer or the upper electrode, if the organic electroluminescence layer explodes to push up the layers thereon. In such a case, a cavity is formed under the overhang protrusion. The cavity may be referred to as a space defined below the overhang protrusion. If the protective layer is formed by a vapor deposition method on the overhang protrusion, the cavity could be partially unclosed and unsealed by the protective layer, that is to say, the cavity is exposed to the air. In this case, substances in the air may go into the cavity and may be absorbed into the organic electroluminescence layer and creates the irregular spot. For example, moisture contained in the air may be absorbed. Therefore, the unclosed and unsealed cavity may create the dark spot of which luminosity is lowered.

It is an object of the disclosure to provide an organic electroluminescence display device with improved quality.

It is an object of the disclosure to provide a method of manufacturing an organic electroluminescence display device with improved quality.

It is another object of the disclosure to provide an organic electroluminescence display device and manufacturing method of the same which is capable of reducing irregular spots on the device.

It is another object of the disclosure to reduce irregular spots on the organic electroluminescence display device. It is another object of the disclosure to reduce a short circuit at the portion already broken.

It is another object of the disclosure to reduce a partially unclosed or unsealed cavity below the overhang protrusion.

According to the disclosure, an organic electroluminescence display device and manufacturing method of the same are provided. One embodiment provides an organic electroluminescence display device which comprises a base substrate; a laminated portion formed on the base substrate; and a protective layer formed on the laminated portion. The laminated portion comprises layers including: a lower electrode; an organic electroluminescence layer; and an upper electrode. At least a portion of the organic electroluminescence layer and the upper layer among the laminated portion is exploded to form a cavernous portion which defines a cavity communicated to the outside.

The protective layer is formed to cover whole surface of a wall of the cavernous portion exposed to the cavity.

It is possible to prevent substances contained in the cavity of the cavernous portion from being contact to the layers, e.g., the organic electroluminescence layer and the upper layer. Therefore, even if substances contained in the cavity may create an irregular spot, it is possible to avoid substances from absorbing into the layer and to reduce the irregular spot. Moreover, a short circuit between the upper and lower electrodes can be prevented. The cavernous portion may be formed by a screening processing in which the organic electroluminescence display device is inspected by leakage current by applying voltage between the lower electrode and the upper electrode.

The protective layer may include at least two layers including an organic material layer and an inorganic material layer laminated in this order from the laminated portion. According to this embodiment, it is possible to provide a configuration in which stress from the inorganic material layer which is harder than the organic material layer can be eased by the organic material layer.

According to an embodiment, the organic electroluminescence display device is manufactured by a method for manufacturing the same. The method comprises a step of forming the laminated portion on the base substrate prepared; and a step of forming the protective layer on the laminated portion after the laminated portion is formed so that the protective layer covers whole surface of a wall of the cavernous portion exposed to the cavity.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Hereafter, an embodiment provided by the present disclosure is explained based on attached drawings. Components and parts corresponding to the components and parts described in the preceding description may be indicated by the same reference number and may not be described redundantly. In a case that only a part of component or part is described, other descriptions for the remaining part of component or part in the other description may be incorporated. The embodiments can be partially combined or partially exchanged in some forms which are clearly specified in the following description. In addition, it should be understood that, unless trouble arises, the embodiments can be partially combined or partially exchanged each other in some forms which are not clearly specified.

First Embodiment

A first embodiment of the present disclosure is explained with reference to the attached drawings. Configuration of the organic electroluminescence display device (hereinafter, may be also referred to as OELD) of the embodiment is explained with reference to FIGS. 1 to 4.

Figure 1:
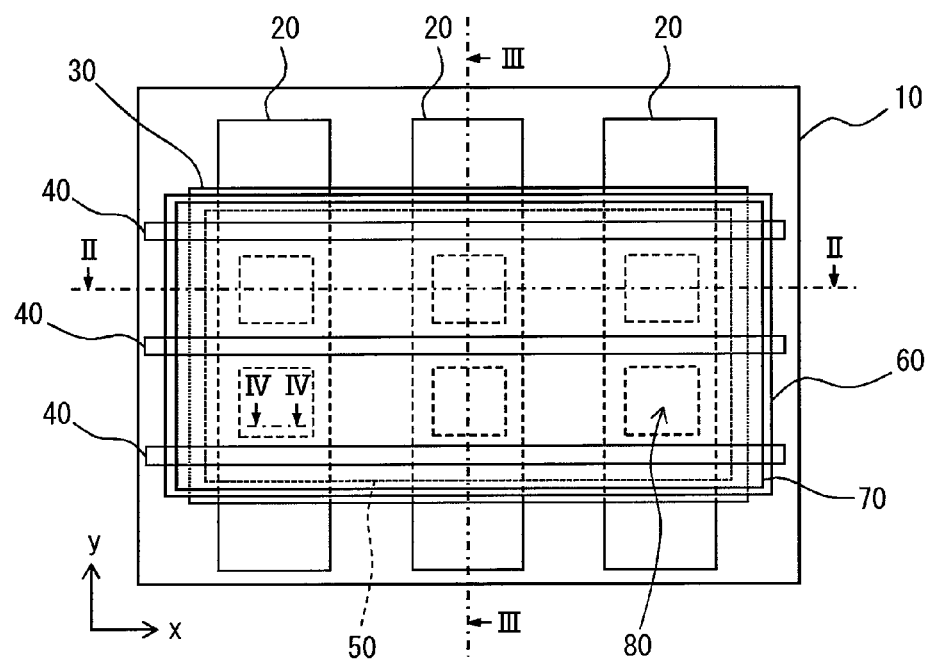
FIG. 1 is a plan view of an organic electroluminescence display device according to an embodiment of the present disclosure.
Figure 2:
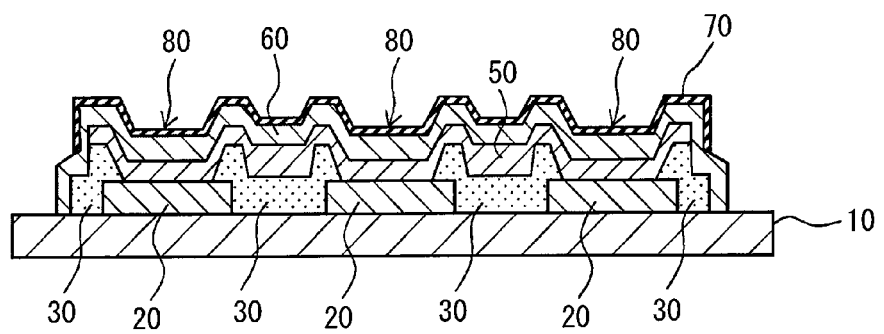
FIG. 2 is a cross sectional view at II-II line in FIG. 1.
Figure 3:
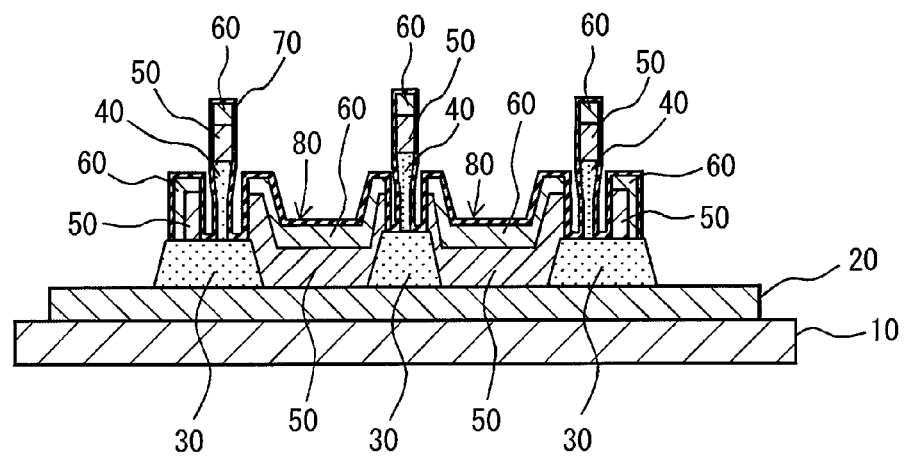
FIG. 3 is a cross sectional view at line in FIG. 1.

As shown in FIGS. 1 to 3, OELD has a base substrate 10, an anode 20, a first insulating layer 30, a second insulating layer 40, an organic electroluminescence layer 50, a cathode 60, and a protective layer 70. Among these, the base substrate 10 is a transparent glass substrate etc.

The anode 20 is a lower electrode formed in a layer by a conductive material such as a conductive oxide film which may be made of ITO. The anode 20 works as a hole injecting electrode. The anode 20 may be called as a data line. The anode 20 is formed in a stripe-shape on the base substrate 10 to extend along the Y-axis shown in the drawings. The anode 20 is provided by a plurality of stripes of conductive films. The anode 20 is made of a conductive oxide film, such as ITO (Indium Oxide, Tin-doped Indium Oxide), for example. The anode 20 may has thickness about 150 nm. The anode 20 may be formed by a spattering method.

The first insulating layer 30 is formed to extend along both X-axis and Y-axis. The first insulating layer 30 is formed above the anode 20 to cover a part of the anode 20 and to expose another part of the anode 20, which corresponds to a pixel of the device. Regarding a direction along X-axis, the first insulating layer 30 is formed to cross the anode 20 which extends along the Y-axis. Regarding a direction along Y-axis, the first insulating layer 30 is formed to be located above the base substrate 10 located between the stripes of the anode 20, and to cover end rims of the stripes of the anode 20 which has a width corresponding to X-axis.

The second insulating layer 40 is an insulating film for dividing the cathode 60 into a plurality of stripes extending along X-axis. The second insulating layer 40 is formed above the first insulating layer 30.

The insulating layers 30 and 40 are insulating layers made of resin material having an electrical insulation property, for example, a negative type photosensitive resin resist material etc.

The organic electroluminescence layer (hereinafter may also be referred to as OELL) 50 is a layer for emitting light. OELL 50 is formed with a plurality of layers not illustrated. OELL 50 may includes layers such as a hole injecting and transporting layer, a light emitting layer, and an electron injecting and transporting layer, etc. which are formed in this order in a laminated manner. OELL 50 is formed above the anode 20, the first insulating layer 30, and the second insulating layer 40. OELL 50 has almost uniform thickness. OELL 50 has uniform thickness with respect to a thickness direction of the device. In OELL 50, the layers may be formed by using a method among such as a vapor deposition, and an ink-jet printing.

The cathode 60 is an upper electrode made of light reflective material, such as aluminum and an aluminum alloy. The cathode 60 works as a electron injecting electrode. The cathode 60 may be called a scanning line. The light reflective material providing the cathode 60 has a thickness equal to or more than 135 nm, e.g., 200 nm. The cathode 60 is formed, for example by the vapor deposition method.

In FIG. 1, the cathode 60 is illustrated as a single continuous layer. However, the cathode 60 is divided with respect to a direction along Y-axis, into a plurality of stripes extending longer along X-axis as shown in FIG. 3.

According to the configuration, both the anode 20 and the cathode 60 are formed in a plurality of stripes which extend longer along Y-axis and X-axis respectively. The stripes of the anode 20 and the stripes of the cathode 60 are arranged to cross each other at overlapping portions. In FIG. 1, six crossings are illustrated. A laminated portion 80 is arranged above each one of the crossings. The laminated portion 80 is arranged above the base substrate 10. The laminated portion 80 is formed by laminating the anode 20, OELL 50, and the cathode 60 in this order above the made substrate 10. One of the laminated portions 80 located above one of the crossing corresponds to and provides a pixel of the OELD. The protective layer 70 is a layer formed on the laminated portion 80.

Especially, the protective layer 70 is a layer which covers a portion which is a part of OELL 50 and the cathode 60 and is exploded by a screening processing. A portion which is a part of OELL 50 and the cathode 60 and is exploded by the screening processing corresponds to a portion at which a leakage current equal to or more than a predetermined value is observed in a leakage current measuring processing. In the leakage current measuring processing, a leakage current, which may flow between the anode 20 and the cathode 60 with a predetermined time interval "S" which is equal to or shorter than 28 μs, for example, is measured and analyzed to determine defective product. The leakage current measuring processing is explained later.

Figure 4:
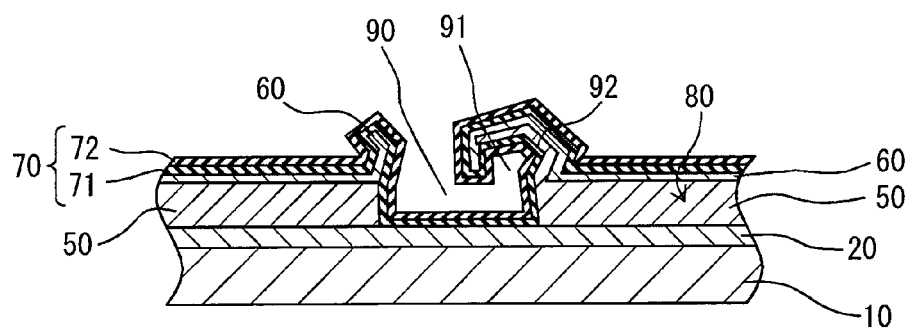
FIG. 4 is a cross sectional view at IV-IV line in FIG. 1.

As shown in FIG. 4, by performing the leakage current measuring processing, the cavernous portion 90 may be formed on the laminated portion 80. The cavernous portion 90 is formed by exploding at least a portion of OELL 50 and the cathode 60. The cavernous portion 90 is a defective portion that is opened electrically. The cavernous portion 90 may also be referred to as an open defective portion on OELD. A cavity 91 of the cavernous portion 90 communicates with the outside of the cavernous portion 90. A wall 92 of the cavernous portion 90 is provided by OELL 50 and the cathode 60 exposed by explosion and exposed at the exploded portion.

At the screening processing, if the cavernous portion 90 is formed, the cavernous portion 90 may get various shapes. For example, if energy of explosion is small, OELL 50 and the cathode 60 may become an umbrella like shape or a flower bud like shape at the cavernous portion 90. If energy of explosion is large, OELL 50 and the cathode 60 may burst vigorously and become a fully bloomed flower like shape. Therefore, the cavernous portion 90 is not limited to a shape like a cavern forming a cavity extending rather longer. The cavernous portion 90 is not limited by shapes itself. It should be understood that the cavernous portion 90 means and covers wide variation of shapes of a portion of depression or creator formed by an explosion on OELL 50 and the cathode 60.

As mentioned above, it is possible to detect an explosion of OELL 50 and the cathode 60 in the screening processing by using an aluminum and an aluminum alloy as material for the cathode 60 and setting the thickness of the cathode 60 equal to or thicker than 135 nm. In other words, it is possible to detect an explosion of OELL 50 and the cathode 60 in the screening processing by measuring and analyzing the leakage current. Although the shapes caused by explosions may widely vary, FIG. 4 shows an example of the cavernous portion 90. In this example, the cavernous portion 90 is not a fully bloomed flower shape, rather covered by a remaining fillet of exploded part.

The protective layer 70 is formed so that the protective layer 70 covers whole surface of a wall 92 of the cavernous portion 90 which defines the cavity 91. In other words, the protective layer 70 completely covers the surface of the wall 92 in order to prevent air contained in the cavity 92 from being contact with the surface of the wall 92 of the cavernous portion 90.

Thus, since the whole surface of the wall 92 of the cavernous portion 90 is thoroughly covered by the protective layer 70, the air existing in the cavity 91 of the cavernous portion 90 does not touch OELL 50 or the cathode 60 which defines the cavernous portion 90. Therefore, it is possible to prevent moisture contained in air in the cavity 91 from being absorbed into OELL 50. In addition, it is possible to reduce creation of a dark spot which may be created by a part of OELL 50 that absorbs moisture contained in air in the cavity 91.

Since the whole surface of the wall 92 of the cavernous portion 90 is covered with the protective layer 70 which is a nonconductive member, it is possible to prevent OELL 50 and the cathode 60, which defines the cavernous portion 90, from hanging down due to an aging deterioration. For this reason, the anode 20 and the cathode 60 on the surface of the wall 92 does not come to make direct contact with each other, and does not make a short circuit.

Such a protective layer 70 is a laminated layer having two layers including an organic material layer 71 and an inorganic material layer 72 laminated in this order from the laminated portion 80. The organic material layer 71 is an ultra-thin film formed by using the molecular layer depositing method (Molecular Layer Deposition; MLD) or the atomic layer deposition method (Atomic Layer Deposition; ALD).

The inorganic material layer 72 is an ultra-thin film formed by using the atomic layer deposition method. The thickness of the organic material layer 71 and the inorganic material layer 72 may be set within a range from some nanometers (nm) to tens of nanometers (nm).

The inorganic material layer 72 is a film harder than the organic material layer 71. Therefore, the organic material layer 71 that is a softer one is formed on OELL 50 and the cathode 60. That is, the organic material layer 71 works to ease the stress which may be applied on the inorganic material layer 72. The organic material layer 71 may be made of polymer material, such as Trimethylaluminum (TMA, $Al(CH_3)_3$), Ethanolamine (EA, $HO-CH_2CH_2-NH_2$), and Maleicanhydride (MA, $C_4H_2O_3$). The inorganic material layer 72 may be made of $Al_2O_3$ etc.

Although it is not shown in the drawings, the end of the anode 20 in Y-axis direction may be connected to a lead wiring which is a column wiring. Similarly, the end of the cathode 60 in X-axis direction may be connected to a lead wiring which is a row wiring.

Figure 5A:
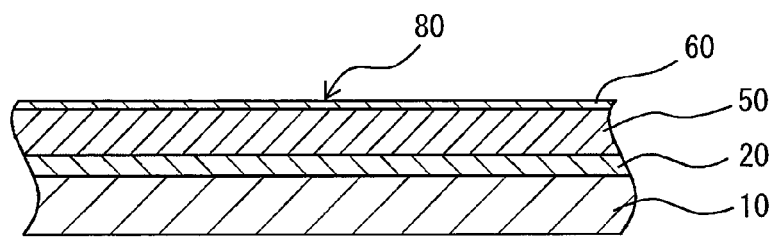
FIG. 5A is a cross sectional view, which corresponds to FIG. 4, of an intermediate product in a manufacturing method.
Figure 5B:
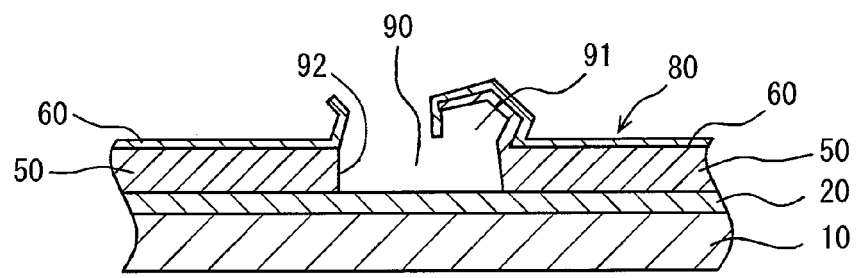
FIG. 5B is a cross sectional view, which corresponds to FIG. 4, of an intermediate product in a manufacturing method.
Figure 5C:
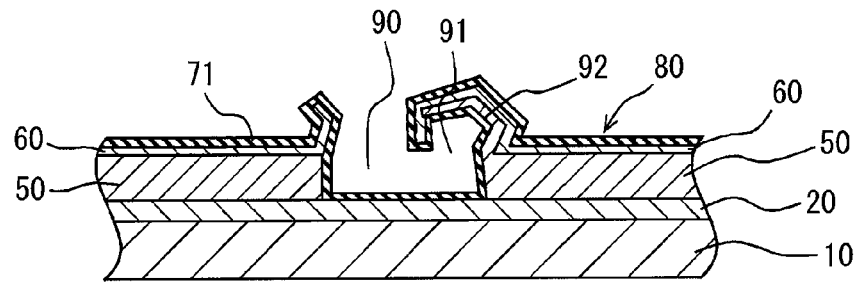
FIG. 5C is a cross sectional view, which corresponds to FIG. 4, of an intermediate product in a manufacturing method.

Then, a forming method of the protective layer 70 is explained with reference to FIGS. 5A through 5C. FIGS. 5A through 5C show transition of cross-sectional shape in the cross section corresponding to FIG. 4.

At a processing step shown in FIG. 5A, the anode 20, OELL 50, and the cathode 60 are formed on the base substrate 10 in the above order. In this step, as mentioned above, the cathode 60 is formed by using an aluminum or an aluminum alloy, and is formed to have a thickness of not less than 135 nm.

Then, at a processing step shown in FIG. 5B, a screening processing is performed. In this step, a predetermined voltage is applied between the anode 20 and the cathode 60 and a current may be supplied to OELL 50. In this step, by monitoring current and analyzing the current, an existence of a breakage or explosion at a leakage portion on the OELL 50 is detected.

The screening processing is carried out as a part of steps in a manufacturing processing for manufacturing OELD. An aging processing is performed. In the aging processing, a processing to make a defective portion on the laminated portion 80 apparent is performed. In the aging processing, a reverse bias voltage is applied between the electrodes 20 and 60. The reverse bias voltage is opposite to a voltage applied to the OELD when the OELD is used. In the aging processing, the reverse bias voltage is applied between the anode 20 and the cathode 60. In the aging processing, the anode 20 is used as a negative electrode, and the cathode 60 is used as a positive electrode. A leakage current measuring processing is performed during the whole period of voltage applying in the aging processing. In the leakage current measuring processing, a value of leakage current which flows between the electrodes 20 and 60 is measured and analyzed. That is, the device is placed under an ageing processing and simultaneously the leakage current is measured.

In detail, the aging processing is performed by applying the reverse bias voltage "V" between the electrodes 20 and 60. The reverse bias voltage "V" is a voltage which makes apparent a defective portion which may exist in the laminated portion 80. In the embodiment, the reverse bias voltage "V" is set higher than a voltage that is applied when OELD is normally use. This setting of the reverse bias voltage "V" promotes actualization of the open defective portion which is a portion where OELL 50 and the cathode 60 are exploded. The reverse bias voltage "V" can be applied by using a DC power supply which is not shown. The DC power supply may be controlled by a controller which is not shown. In this case, for example, the DC power supply may be connected with each one of the upper and lower electrodes 20 and 60 shown in FIG. 1. The DC power supply is controlled to apply the reverse bias voltage "V" to all of the laminated portions 80 at the same time. Thereby, it is possible to perform an inspection processing for a plurality of pixels at once. In the inspection processing, whether an open defective portion exists or not is inspected. It is possible to perform the inspection processing in a short time. Alternatively, the reverse bias voltage "V" may be applied to each one of pixel in a sequential manner.

Measurement of the leakage current which flows between the electrodes 20 and 60 is started when the reverse bias voltage "V" is applied. In order to measure the leakage current, the current measuring device (not shown) which measures direct-current is located between the cathode 60 and the DC power supply or between the anode 20 and the DC power supply. While applying the reverse bias voltage "V" to the laminated portion 80, the controller controls the current measuring device to detect and measure a value of the leakage current flowing through the laminated portion 80. The controller receives the value of the leakage current measured by the current measuring device. The controller analyzes the value of the leakage current to detect the open defective portion. For example, the controller compares the value of the leakage current with a predetermined threshold value, and detects the open defective portion when the measured value exceeds the threshold.

The controller controls the current measuring device to acquire data of measured value with a predetermined time interval "S". Thus, the current measuring device controlled by the controller measures the leakage current intermittently with the predetermined time interval "S" during the reverse bias voltage "V" is applied. In other words, the leakage current is measured in a sampling manner. The probability of measuring an instantaneous spike current may be increased as the time interval "S" is shortened. The shorter the time interval "S", the more the probability of measuring the instantaneous spike current. However, since the number of data increases as the time interval "S" is shortened, cost for an inspection device may increase. Therefore, in this embodiment, the time interval "S" is set equal to or less than 28 microseconds. Thereby, it is possible to certainly detect the instantaneous spike current, i.e., the open defective portion. In this embodiment, the time interval "S" is set to corresponds to the half-value width of the observed instantaneous spike current.

Application of the reverse bias voltage "V" and measurement of the leakage current are carried out until an elapsed time from a beginning of application of the reverse bias voltage "V" reaches to a predetermined threshold time which is required to make the defective portion apparent. Since the predetermined threshold time required to make the defective portion apparent varies depending upon a value of the reverse bias voltage "V", the predetermined threshold time may be suitably set according to a value of the reverse bias voltage "V" applied. For example, the reverse bias voltage "V" may be set to 28V. A predetermined application time for applying the reverse bias voltage "V" may be set to 60 seconds. The reverse bias voltage "V" is continuously applied for the predetermined application time. Then, after the predetermined application time has elapsed, application of the reverse bias voltage and measurement of the leakage current are finished. By the above, the aging step and the leakage current measuring step can be performed and completed.

Then, the quality of pixel is determined based on the leakage current measured at the leakage current measuring step. In this embodiment, as described above, the leakage current measured by the current measuring device is compared with a predetermined threshold value by the controller. The controller determines and picks OELD that may have at least one open defective portion up. If the measured value of the leakage current momentarily exceeds the threshold during the leakage current measuring step for OELD, this OELD may be considered having at least one open defective portion. In addition, if the measured value of the leakage current once exceeds the threshold value, and after that, it continuously exceeds the threshold value until application of the reverse bias voltage "V" is completed, inspected OELD is considered as a defective device in which the anode 20 and the cathode 60 are short-circuited. If the measured value of the leakage current is kept equal to or less than the threshold value, inspected OELD is determined as a good product which has no short circuit and open detective portion. The value of the leakage current observed on a good product of OELD may even vary depending upon structures of the laminated portion 80. In addition, a peak value of the instantaneous spike current may vary depending upon a value of the reverse bias voltage "V". Therefore, the threshold value used for determining the open defective portion is suitably set up according to several parameters and condition. As mentioned above, it is possible to determine whether or not OELD has at least one open defective portion which could cause a short circuit in an actual use.

According to the method explained above, an open defective portion and a short-circuited defective portion on OELD having the cathode 60 with thickness equal to or larger than 135 nm can be made apparent by applying the reverse bias voltage "V" to the electrodes 20 and 60 provided thereon. While making apparent the defective portions, it is possible to determine whether a pixel is good or bad based on the measured value of the leakage current during applying the reverse bias voltage "V".

When there is a predetermined detection of the leakage current, a shape of explosion on OELL 50 and the cathode 60 becomes like a bloomed flower due to an effect of the material and the thickness of the cathode 60. Thereby, the exploded portion is formed into the open defective portion. In FIG. 5B, a remains of explosion is still located above the cavernous portion 90 to cover at least a portion of the cavernous portion 90 similar to the example illustrated in FIG. 4.

On the laminated portion 80, the cavernous portion 90 is created by exploding a leakage portion, i.e., by turning the leakage portion into the open defective portion. In other words, since the layers, such as OELL 50, which should exist at the leakage portion, is destroyed and exploded, the cavernous portion 90 which is a depression or hole is formed on the portion destroyed.

Then, at a processing step shown in FIG. 5C, the organic material layer 71 is formed by the molecular layer depositing method. In this method, the base substrate 10 which has finished the processing step shown in FIG. 5B is placed in and arranged to an organic material layer forming device which is not illustrated, and the base substrate 10 is exposed to one or more kinds of gas phase reaction substances in the machine. By this processing, an organic polymer as the organic material layer 71 is formed on the laminated portion 80.

By using this molecular layer depositing method, the organic polymer, which is a gas phase reaction material, reacts with the functional group on a surface of the members, such as the substrate 10 and the laminated portion 80, or the functional group of a polymer chain which grows. The organic polymer combines with a surface of the members, such as the base substrate 10 or the laminated portion 80, or the polymer chain growing. That is, since the gas phase reaction material reacts with the surface of the laminated portion 80 etc. or the polymer chain growing only by single functionality, a molecular layer can be thickened thereon.

Here, even if a portion like an umbrella is formed by the cathode 60 as shown in FIG. 5C, since the method uses the gas phase reaction material, the gas phase reaction material can enter into the cavernous portion 90. For this reason, the organic material layer 71 can be formed so that the whole surface of the wall 92 of the cavernous portion 90 may be covered with the organic material layer 71. That is, it is possible to be covered thoroughly by the organic material layer 71 to eliminate portion which may contact with air from the surface of the wall 92 of the cavernous portion 90.

Next, the inorganic material layer 72 is formed on the organic material layer 71. In this embodiment, the inorganic material layer 72 is not formed as a single layer made of single material. The layer is formed as a nano-composite layer at least including a part of the organic material layer 71 and the inorganic material layer 72. That is, an organic-inorganic composite material is formed by combining the approach of MLD for the polymer deposition with ALD, in order to grow up the inorganic material.

Here, the organic-inorganic composite material is formed by depositing a plurality of layers of the organic material layer 71, and then, by depositing the inorganic material layer 72 continuously. Although the structure in which the protective layer 70 is formed by the single organic material layer 71 and the single inorganic material layer 72 is shown by FIG. 4 and FIGS. 5A through 5C, as mentioned above, the organic material layer 71 and the inorganic material layer 72 may be configured by laminating them alternately in plural times.

An organic-inorganic nano-composite layer is formed by depositing an organic polymer layer and an aluminum layer alternately. The organic polymer layer may be provided by Trimethylaluminum etc. After depositing the organic polymer layer, an aluminum layer ($Al_2O_3$) is deposited as the inorganic material layer 72 by soaking it to Trimethylaluminum (TMA) and water in this order. At this time, since the inorganic material layer 72 is deposited on the organic material layer 71, it is possible to form the inorganic material layer 72 on the organic material layer 71 formed on the surface of the wall 92 of the cavernous portion 90. As a result, the structure shown in FIGS. 1 to 4 is provided.

In addition, a double or triple layered structure of the organic polymer/$Al_2O_3$ may be formed. For example, a further organic polymer layer may be deposited after depositing the aluminum layer explained above, and then, a further aluminum layer may be deposited on the further organic polymer layer. Although the protective layer 70 is formed to cover the laminated portion 80, the protective layer 70 shall be formed to expose contact portions on the anode 20 and the cathode 60.

According to the embodiment, the cavernous portion 90 is not a simple crater shape. The cavernous portion 90 has a fillet, which still connected to a flawless part of the laminated portion 80 and extends from a radial outside rim to inside of the cavernous portion 90. The fillet extends over a crater to form an overhang. The illustrated one of the cavernous portion 90 defines a cavity which has small inlet but provides large volume relative to the inlet. The cavernous portion 90 defines the cavity which extends along a direction parallel to a plane surface of the OELD, i.e., the plane defined by X-axis and Y-axis. The protective layer 70 covers all of the laminated portions 80 on the OELD. The protective layer 70 covers whole surface formed on the exploded portion on a defective laminated portion 80.

The cavernous portion 90 forming step is performed so that the cavernous portion 90 has an overhang protrusion which is formed by exploding a part of the laminated portion 80. The overhang protrusion protrudes to define the cavity 91 between the overhang protrusion and remaining portion of the laminated portion 80 below the overhang protrusion. The protective layer forming step is performed so that the protective layer 70 covers both an upper surface and a lower surface of the overhang protrusion. The protective layer forming step is also performed so that the protective layer 70 covers a surface of the remaining portion of the laminated portion 80 which is located below the overhang protrusion. As a result, the protective layer 70 covers entire surface of the cavernous portion 90 without forming an unsealed cavity which may allow the air's direct contact to the material forming the OELL 50.

The controller used in the manufacturing processing is an electrical control unit (ECU). The controller has at least one processing unit (CPU) and at least one memory device provided as a storage medium which stores a set of program and data. The controller is provided with a microcomputer having the storage medium readable by a computer. The storage medium is a non-transitory storage medium which stores a program readable by the computer. The storage medium can be provided by a device, such as a solid state memory device and a magnetic disc memory. The controller is provided with one computer, or a set of computer resources linked by a data communication device. The program, when executed by the controller, makes the controller to function as devices described in this specification, and makes the controller to perform methods described in this specification. The controller provides a plurality of various elements. At least a part of those elements may be called as means for performing functions, and, in another aspect, at least a part of those elements may be called as structural blocks or modules.

As explained above, among the laminated portions 80, at least on a part where the cavernous portion 90 is formed, the protective layer 70 is formed to cover the whole surface of the wall 92 of the cavernous portion 90. It is possible to reduce degradation of OELL 50 caused by absorbing moisture through the wall 92 on the cavernous portion 90. It is possible to reduce generating of a dark spot caused by deterioration of OELL 50. It is possible to reduce an event that the open defective portion turns into a short circuit.

Second Embodiment

Figure 6:
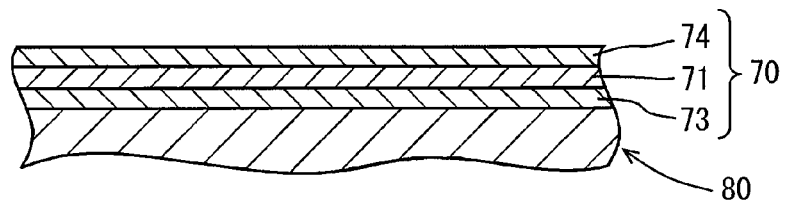
FIG. 6 is an enlarged cross sectional view of an organic electroluminescence display device according to another embodiment of the present disclosure.

In the following description, differences from the preceding embodiment are mainly explained. In this embodiment, as shown in FIG. 6, the protective layer 70 has three-layered structure. In detail, the protective layer 70 at least includes three layers including a first layer 73 made of $Al_2O_3$, a second layer 71 made of organic material, and a third layer 74 made of AlTiO laminated in this order from the laminated portion 80. The organic material layer 71 is made of the same material as explained in the first embodiment. Thus, the protective layer 70 may be three layers.

Other Embodiment

The configuration of the organic electroluminescence display device shown as the embodiments above are merely intended to provide examples. The configuration of the organic electroluminescence display device is not limited to the embodiments, and may be provided by the other configuration that can realize the present disclosure. For example, the protective layer 70 is made of the single organic material layer 71 and the single inorganic material layer 72 in the first embodiment. Alternatively, the protective layer 70 may be provided by stacking two or more pairs of the organic material layer 71 and the inorganic material layer 72.

In the second embodiment, the protective layer 70 has the third layer 74 made of AlTiO as a most upper layer. Alternatively, the third layer 74 may be made of $TiO_2$. That is, the protective layer 70 has at least includes three layers including a first layer made of $Al_2O_3$, a second layer made of organic material, and a third layer laminated in this order from the laminated portion 80. The third layer may be made of one of AlTiO or $TiO_2$.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, are preferred, other combinations and configurations, including more, less or only a single element, are also within the spirit and scope of the present disclosure.

What is claimed is:

1. An organic electroluminescence display device, comprising:
    a base substrate;
    a multilayer laminate formed on the base substrate, the multilayer laminate comprising a lower electrode layer, an organic electroluminescence layer and an upper electrode layer; and the multilayer laminate having a broken surface, the broken surface containing a cavernous-shaped broken portion having a cavity comprising:
        a crater contained within the multilayer laminate and free from at least a portion of the organic electroluminescence layer and the upper electrode layer contained in remaining portions of the multilayer laminate, and
        an overhang protrusion extending above and covering at least a portion of the crater and containing a displaced portion of the organic electroluminescence layer and the upper electrode layer of the multilayer laminate; and
    a protective layer formed on the multilayer laminate,
    wherein the crater, the overhang protrusion and the broken surface each have a form and shape resulting from an explosion of a portion of the organic electroluminescence layer contained in the multilayer laminate, and
    wherein the protective layer is an ultra-thin film completely covering the broken surface of the multilayer laminate including the cavity of the cavernous-shaped broken portion and preventing the broken surface from contacting the outside air.

2. The organic electroluminescence display device claimed in claim 1, wherein
    the overhang protrusion of the cavernous-shaped broken portion is formed by a screening processing in which the organic electroluminescence display device is inspected by leakage current by applying voltage between the lower electrode layer and the upper electrode layer.

3. The organic electroluminescence display device claimed in claim 1, wherein
    the protective layer at least includes two layers including an organic material layer and an inorganic material layer laminated in this order from the multilayer laminate.

4. The organic electroluminescence display device claimed in claim 1, wherein
    the protective layer at least includes three layers including a first layer made of $Al_2O_3$, a second layer made of organic material, and a third layer laminated in this order from the multilayer laminate, and
    the third layer is made of one of AlTiO or $TiO_2$.

5. The organic electroluminescence display device claimed in claim 1, wherein
    the lower electrode layer is an anode, and the upper electrode layer is a cathode, and wherein the anode, the organic electroluminescence layer, and the cathode are laminated in this order from the base substrate.

6. The organic electroluminescence display device claimed in claim 1, wherein
    the protective layer covers both an upper surface and a lower surface of the overhang protrusion, and the broken surface of the multilayer laminate which is located below the overhang protrusion.

7. A method for manufacturing an organic electroluminescence display device which comprises:
    a base substrate;
    a multilayer laminate formed on the base substrate, the multilayer laminate comprising:
        a lower electrode layer;
        an organic electroluminescence layer; and
        an upper electrode layer; and
    a protective layer comprising an ultra-thin film formed on the multilayer laminate,
    wherein the multilayer laminate contains a cavernous-shaped broken portion including a cavity, the cavity including:
        a crater contained within the multilayer laminate and free from at least a portion of the organic electroluminescence layer and the upper electrode layer contained in remaining portions of the multilayer laminate, and
        an overhang protrusion extending above and covering at least a portion of the crater and containing a displaced portion of the organic electroluminescence layer and the upper electrode layer of the multilayer laminate, and
        a broken surface of the multilayer laminate,
    the method comprising the steps of:
        forming the multilayer laminate on the base substrate;
        exploding a portion of the organic electroluminescence layer contained in the multilayer laminate and forming the crater, the overhang protrusion and the broken surface of the multilayer laminate; and
        completely covering the broken surface of the multilayer laminate in the cavity of the cavernous-shaped broken portion with the ultra-thin film of the protective layer and forming a barrier between the broken surface of the multilayer laminate in the cavity of the cavernous-shaped broken portion and outside air.

8. The method claimed in claim 7, further comprising:
    forming the cavernous-shaped broken portion in the multilayer laminate, after the multilayer laminate forming step and before the protective layer forming step, by performing a screening processing in which the organic electroluminescence display device is inspected by leakage current by applying voltage between the lower electrode layer and the upper electrode layer.

9. The method claimed in claim 7, wherein
    the completely covering step includes laminating at least two layers including an organic material layer and an inorganic material layer in this order from the multilayer laminate.

10. The method claimed in claim 7, wherein
    the completely covering step includes laminating three layers including a first layer made of $Al_2O_3$, a second layer made of organic material, and a third layer laminated in this order from the multilayer laminate, wherein the third layer is made of one of AlTiO or $TiO_2$.

11. The method claimed in claim 7, wherein
    the lower electrode layer is an anode, and the upper electrode layer is a cathode, and wherein the anode, the organic electroluminescence layer, and the cathode are laminated in this order from the base substrate.

12. The method claimed in claim 7, wherein
the completely covering step is performed so that the protective layer covers both an upper surface and a lower surface of the overhang protrusion, and a surface of the remaining portions of the multilayer laminate which is located below the overhang protrusion.

* * * * *